(12) United States Patent
Chiang et al.

(10) Patent No.: US 9,117,706 B2
(45) Date of Patent: Aug. 25, 2015

(54) PIXEL STRUCTURE WITH PIXEL ELECTRODE CONNECTED TO CONDUCTIVE PATTERN THROUGH PLURAL CONTACT HOLES

(71) Applicant: E Ink Holdings Inc., Hsinchu (TW)

(72) Inventors: Ming-Sheng Chiang, Hsinchu (TW); Huai-Cheng Lin, Hsinchu (TW); Chih-Cheng Wang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/160,576

(22) Filed: Jan. 22, 2014

(65) Prior Publication Data

US 2014/0264606 A1    Sep. 18, 2014

(30) Foreign Application Priority Data

Mar. 12, 2013 (TW) .............................. 102108688 A

(51) Int. Cl.
*H01L 27/12* (2006.01)

(52) U.S. Cl.
CPC .......... *H01L 27/124* (2013.01); *H01L 27/1218* (2013.01)

(58) Field of Classification Search
CPC .................................................... H01L 29/786
USPC .................................................. 257/59, 350
See application file for complete search history.

(56) References Cited

U.S. PATENT DOCUMENTS

| | | | |
|---|---|---|---|
| 6,657,230 B1 | 12/2003 | Murade | |
| 7,202,928 B2 | 4/2007 | Lee et al. | |
| 7,259,821 B2 | 8/2007 | Kim | |
| 7,528,921 B2 | 5/2009 | Ahn et al. | |
| 7,563,655 B2 | 7/2009 | Lee | |
| 7,952,679 B2 | 5/2011 | Kim et al. | |
| 8,040,445 B2 | 10/2011 | Lee et al. | |
| 2005/0127367 A1 | 6/2005 | Huh et al. | |

(Continued)

FOREIGN PATENT DOCUMENTS

| | | |
|---|---|---|
| TW | 200642085 | 12/2006 |
| TW | 200701463 | 1/2007 |

(Continued)

OTHER PUBLICATIONS

"Office Action of Taiwan Counterpart Application", issued on Mar. 17, 2015, p. 1-p. 5.

*Primary Examiner* — Marc Armand
*Assistant Examiner* — Younes Boulghassoul
(74) *Attorney, Agent, or Firm* — Jianq Chyun IP Office

(57) ABSTRACT

A pixel structure includes a flexible substrate, an active device, a conductive pattern, a first insulation layer, and a pixel electrode. The active device is disposed on the flexible substrate and includes a gate, a channel, a source, and a drain. The source and the drain are connected to the channel and are separated from each other. The channel and the gate are stacked in a thickness direction. The active device is disposed between the conductive pattern and the flexible substrate. The conductive pattern is electrically connected to the drain of the active device. The first insulation layer covers the conductive pattern and has first contact holes separated from one another, and the first contact holes expose the conductive pattern. The first insulation layer is disposed between the pixel electrode and the conductive pattern. The pixel electrode is electrically connected to the conductive pattern through the first contact holes.

11 Claims, 12 Drawing Sheets

(56) References Cited

U.S. PATENT DOCUMENTS

2006/0284254 A1* 12/2006 Liu et al. ............... 257/350
2014/0008655 A1* 1/2014 Chen et al. ............. 257/59

FOREIGN PATENT DOCUMENTS

TW    201039003    * 11/2010    ............ G02F 1/1333
TW    201122692    7/2011

* cited by examiner

M3

PIXEL STRUCTURE WITH PIXEL ELECTRODE CONNECTED TO CONDUCTIVE PATTERN THROUGH PLURAL CONTACT HOLES

CROSS-REFERENCE TO RELATED APPLICATION

This application claims the priority benefit of Taiwan application serial no. 102108688, filed on Mar. 12, 2013. The entirety of the above-mentioned patent application is hereby incorporated by reference herein and made a part of this specification.

BACKGROUND OF THE INVENTION

1. Field of the Invention

The invention relates to a pixel structure; more particularly, the invention relates to a pixel structure that is formed on a flexible substrate.

2. Description of Related Art

With rapid development of display technologies, cathode ray tube (CRT) displays have been gradually replaced by flat panel displays (FPDs). Compared to rigid carriers (e.g., glass substrates) used in the FPDs, the flexible substrates (e.g., plastic substrates) are characterized by flexibility and impact endurance. As a result, the flexible displays in which pixel structures are formed on the flexible substrates have been developed in recent years.

Said flexible displays are required to withstand the impact of an external force to a great extent. Unfortunately, the existing flexible displays often fail the impact test because the pixel structures are easily broken, which indicates that the displays under the impact of the external force are very likely to be cracked and damaged. Therefore, the reliability of the existing flexible displays with respect to impact endurance still leaves room for improvement.

SUMMARY OF THE INVENTION

The invention is directed to a pixel structure that is not apt to malfunction even in case of an external impact.

According to an exemplary embodiment of the invention, a pixel structure is provided. The pixel structure includes a flexible substrate, an active device, a conductive pattern, a first insulation layer, and a pixel electrode. The active device is disposed on the flexible substrate and includes a gate, a channel, a source, and a drain. The source and the drain are connected to the channel and are separated from each other. The channel and the gate are stacked in a thickness direction. The active device is located between the conductive pattern and the flexible substrate. The conductive pattern is electrically connected to the drain of the active device. The first insulation layer has a plurality of first contact holes separated from one another, and the first contact holes expose a portion of the conductive pattern. The first insulation layer is located between the pixel electrode and the conductive pattern. The pixel electrode is electrically connected to the conductive pattern through the first contact holes.

According to an exemplary embodiment of the invention, the first contact holes of the first insulation layer respectively expose a plurality of conductive points of the conductive pattern, and the conductive points are arranged in a scattered manner.

According to an exemplary embodiment of the invention, the conductive points are scattered and located at a periphery of the pixel electrode.

According to an exemplary embodiment of the invention, the conductive pattern is located at a periphery of the pixel electrode.

According to an exemplary embodiment of the invention, the conductive pattern is a ring-shaped pattern surrounding the pixel electrode.

According to an exemplary embodiment of the invention, the conductive pattern and a periphery of the pixel electrode are overlapped when observed in a direction perpendicular to the flexible substrate.

According to an exemplary embodiment of the invention, the pixel structure further includes a capacitor electrode. The capacitor electrode is located between the flexible substrate and the pixel electrode. Besides, the capacitor electrode is electrically connected to a reference potential.

According to an exemplary embodiment of the invention, the pixel structure further includes an auxiliary electrode. The auxiliary electrode is disposed between the flexible substrate and the capacitor electrode. Besides, the auxiliary electrode is electrically connected to the conductive pattern.

According to an exemplary embodiment of the invention, the pixel structure further includes a second insulation layer and a third insulation layer. The second insulation layer is located between the auxiliary electrode and the capacitor electrode. The third insulation layer is located between the capacitor electrode and the conductive pattern.

According to an exemplary embodiment of the invention, the second insulation layer has a second contact hole, and the third insulation layer has two third contact holes. One of the two third contact holes communicates with the second contact hole, and the other of the two third contact holes exposes the drain of the active device. The second contact hole and the third contact hole communicating with the second contact hole are filled with the conductive pattern and the conductive pattern is electrically connected to the auxiliary electrode. The third contact hole exposing the drain of the active device is filled with the conductive pattern and the conductive pattern is electrically connected to the drain of the active device.

According to an exemplary embodiment of the invention, the pixel structure further includes a data line and a scan line. The data line is connected to the source; the scan line is connected to the gate.

In view of the above, the pixel electrode in the pixel structure described in an exemplary embodiment of the invention is electrically connected to the conductive pattern through the contact holes, and the conductive pattern is electrically connected to the active device. Hence, even though the pixel electrode is broken into a plurality of separated sub-pixel electrodes during the impact test, the sub-pixel electrodes can be connected to the conductive pattern through the corresponding contact holes and can further be electrically connected to the active device. As a result, the pixel structure is much more likely to pass the impact test.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
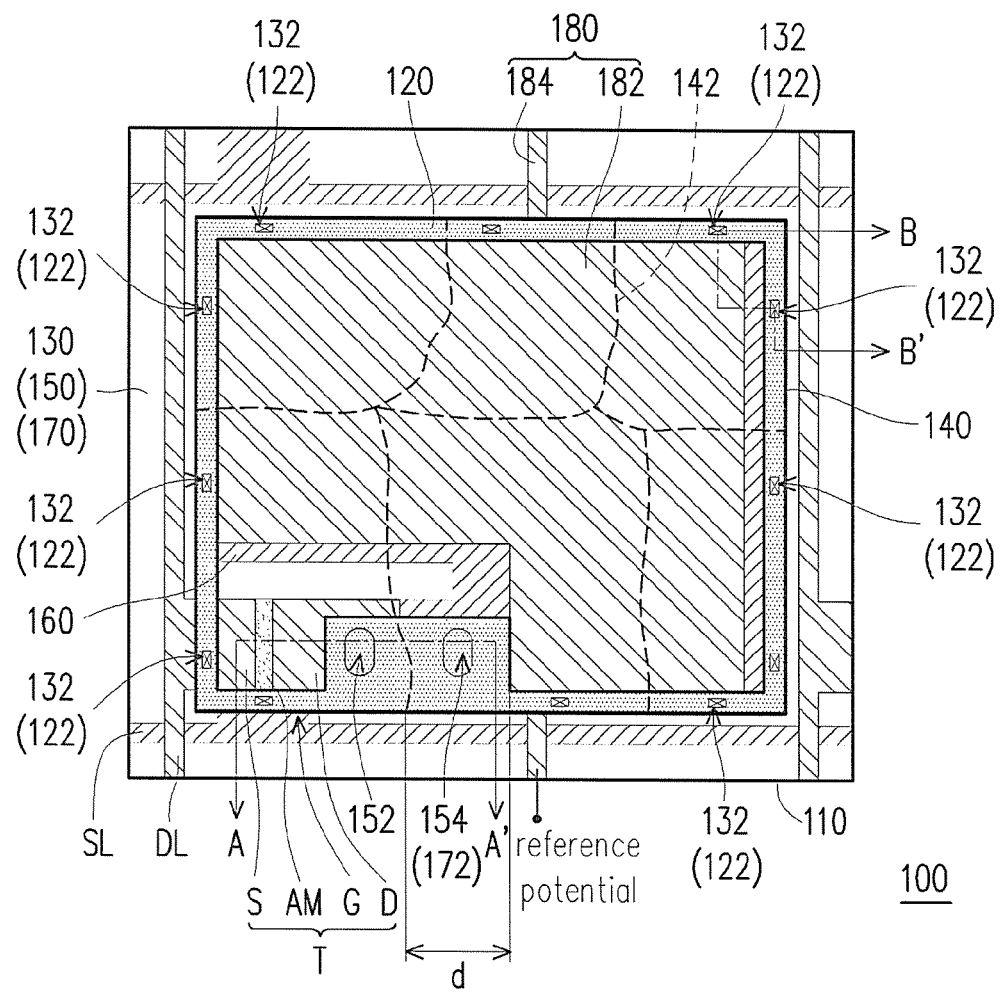
FIG. 1 is a schematic top view illustrating a pixel structure according to an exemplary embodiment of the invention.
Figure 2:
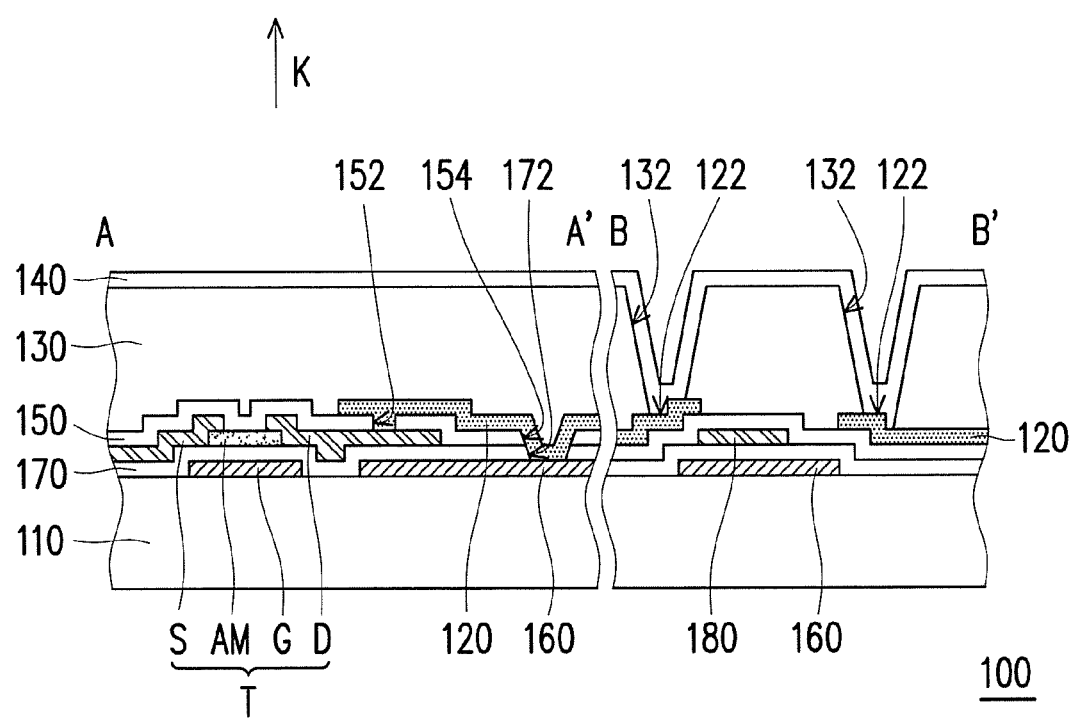
FIG. 2 is a schematic cross-sectional view illustrating the pixel structure of FIG. 1 along a sectional line A-A' and a sectional line B-B'.

FIG. 1 is a schematic top view illustrating a pixel structure according to an exemplary embodiment of the invention. FIG. 2 is a schematic cross-sectional view illustrating the pixel structure of FIG. 1 along a sectional line A-A' and a sectional line B-B'. With reference to FIG. 1 and FIG. 2, the pixel structure 100 includes a flexible substrate 110, an active device T disposed on the flexible substrate 110, a conductive pattern 120, a first insulation layer 130, and a pixel electrode 140. The active device T includes a gate G, a channel AM, a source S, and a drain D. The source S and the drain D are connected to the channel AM and separated from each other, and the channel AM and the gate G are stacked in a thickness direction K (shown in FIG. 2). In the present exemplary embodiment, the conductive pattern 120 is located between the pixel electrode 140 and the flexible substrate 110. The flexible substrate 110 refers to a substrate with flexibility, and a material of the flexible substrate 110 includes plastic materials, which should not be construed as a limitation to the invention.

The active device T is located between the conductive pattern 120 and the flexible substrate 110, and the conductive pattern 120 is electrically connected to the drain D of the active device T. Particularly, the pixel structure 100 described in the present exemplary embodiment further includes a third insulation layer 150 that is located between the conductive pattern 120 and the drain D of the active device T. The third insulation layer 150 has a third contact hole 152. The third contact hole 152 is filled with the conductive pattern 120, and the conductive pattern 120 filled in third contact hole 152 is electrically connected to the drain D of the active device T. In the present exemplary embodiment, the active device T is, for instance, a bottom-gate transistor; however, the invention is not limited thereto, and the active device T in other exemplary embodiments may also be a top-gate transistor or any other appropriate transistor.

The first insulation layer 130 covers the conductive pattern 120 and has a plurality of first contact holes 132 separated from one another, and the first contact holes 132 expose a portion of the conductive pattern 120. Besides, the first insulation layer 130 is located between the pixel electrode 140 and the conductive pattern 120. In the present exemplary embodiment, the conductive pattern 120 is located between the pixel electrode 140 and the flexible substrate 110. Here, the conductive pattern 120 and the pixel electrode 140 may be made of a conductive material with favorable reflectivity and extensibility, e.g., metal. Note that the pixel electrode 140 is electrically connected to the conductive pattern 120 through the first contact holes 132, and the conductive pattern 120 is electrically connected to the drain D of the active device T, for example, through the third contact hole 152. Thus, as shown in FIG. 1, even though the pixel electrode 140 is broken into a plurality of separated sub-pixel electrodes 142 during an impact test, the sub-pixel electrodes 142 can be electrically connected to the drain D of the active device T through the conductive pattern 120, such that the pixel electrode 140 does not malfunction. Namely, through the conductive pattern 120 and the first contact holes 132, the area occupied by the conductive points 122 between the pixel electrode 140 and the active device T in the pixel structure 100 may be expanded, so as to reduce the malfunction possibility of the pixel electrode 140 during the impact test.

The first contact holes 132 of the first insulation layer 130 respectively expose the conductive points 122 of the conductive pattern 120. According to the present exemplary embodiment, the conductive points 122 may be arranged in a scattered manner. For instance, as shown in FIG. 1, the conductive points 122 are scattered and located at a periphery of the pixel electrode 140. Owing to the scattered conductive points 122, the possibility that the broken sub-pixel electrodes 142 are still electrically connected to the active device T may be raised, and thereby the pixel structure 100 is more likely to pass the impact test.

With reference to FIG. 1 and FIG. 2, the pixel structure 100 described in the present exemplary embodiment further includes an auxiliary electrode 160. According to the present exemplary embodiment, the auxiliary electrode 160 may be made of a conductive material with favorable reflectivity and extensibility, e.g., metal. The auxiliary electrode 160 is located between the flexible substrate 110 and the conductive pattern 120 and electrically connected to the conductive pattern 120. Particularly, the pixel structure 100 further includes a second insulation layer 170 that is located between the auxiliary electrode 160 and the conductive pattern 120. The third insulation layer 150 is located between the conductive pattern 120 and the second insulation layer 170. The second insulation layer 170 has a second contact hole 172. The second contact hole 172 communicates with a third contact hole 154 of the third insulation layer 150. The conductive pattern 120 fills the second and the third contact holes 172 and 154 and is electrically connected to the auxiliary electrode 160.

The pixel structure 100 described in the present exemplary embodiment further includes a capacitor electrode 180. The capacitor electrode 180 is located between the flexible substrate 110 and the pixel electrode 140. The auxiliary electrode 160 is located between the flexible substrate 110 and the capacitor electrode 180, and the capacitor electrode 180 is electrically connected to a reference potential. In the present embodiment, the capacitor electrode 180 and the pixel electrode 140 are not physically connected but are coupled to each other. Besides, the capacitor electrode 180 and the auxiliary electrode 160 are not physically connected but are coupled to each other. Here, the design of the capacitor electrode 180 coupled to the pixel electrode 140 and the auxiliary electrode 160 constitutes a storage capacitor structure. The overlapping area between the capacitor electrode 180 and the pixel electrode 140 and the overlapping area between the capacitor electrode 180 and the auxiliary electrode 160 determine the value of the capacitance of the storage capacitor structure. In particular, most of the capacitor electrode 180 may be overlapped with the pixel electrode 140 and the auxiliary electrode 160, so as to increase the value of the storage capacitance as well as ensure the display stability of the pixel structure 100.

According to the present exemplary embodiment, the conductive pattern 120 may be designed to ensure that the conductive points 122 are properly scattered and that the value of the storage capacitance of the pixel structure 100 is not excessive. Besides, the relative locations of the conductive pattern 120, the pixel electrode 140, the capacitor electrode 180, and the auxiliary electrode 160 are arranged in an appropriate manner. For instance, the conductive pattern 120 may be a ring-shaped pattern that surrounds the pixel electrode 140, and the ring-shaped conductive pattern 120 may be overlapped with the a periphery of the pixel electrode 140 when observed in a direction perpendicular to the flexible substrate 110 (the direction perpendicular to the paper plane of FIG. 1, i.e., the thickness direction K shown in FIG. 2). The capacitor electrode 180 may be divided into an electrode portion 182 and a connection portion 184 extending from the electrode portion 182, and the electrode portion 182 is overlapped with the auxiliary electrode 160. The conductive pattern 120 may cross through the connection portion 184 and surround the electrode portion 182, and it is possible that the conductive pattern 120 and the electrode portion 182 are not overlapped.

From another perspective, the pixel structure 100 described in the present exemplary embodiment further includes a data line DL and a scan line SL. The data line DL is connected to the source S of the active device T, and the scan line SL is connected to the gate G of the active device T. When observed from the direction perpendicular to the flexible substrate 110, the conductive pattern 120 is located between the capacitor electrode 180 and the data line DL and between the capacitor electrode 180 and the scan line SL. Said arrangement ensures that the overlapping area of the conductive pattern 120 and the capacitor electrode 180 is not excessive, that the value of the storage capacitance of the pixel structure 100 may stay within an appropriate range, and that the conductive points 122 may be properly scattered.

Figure 3:
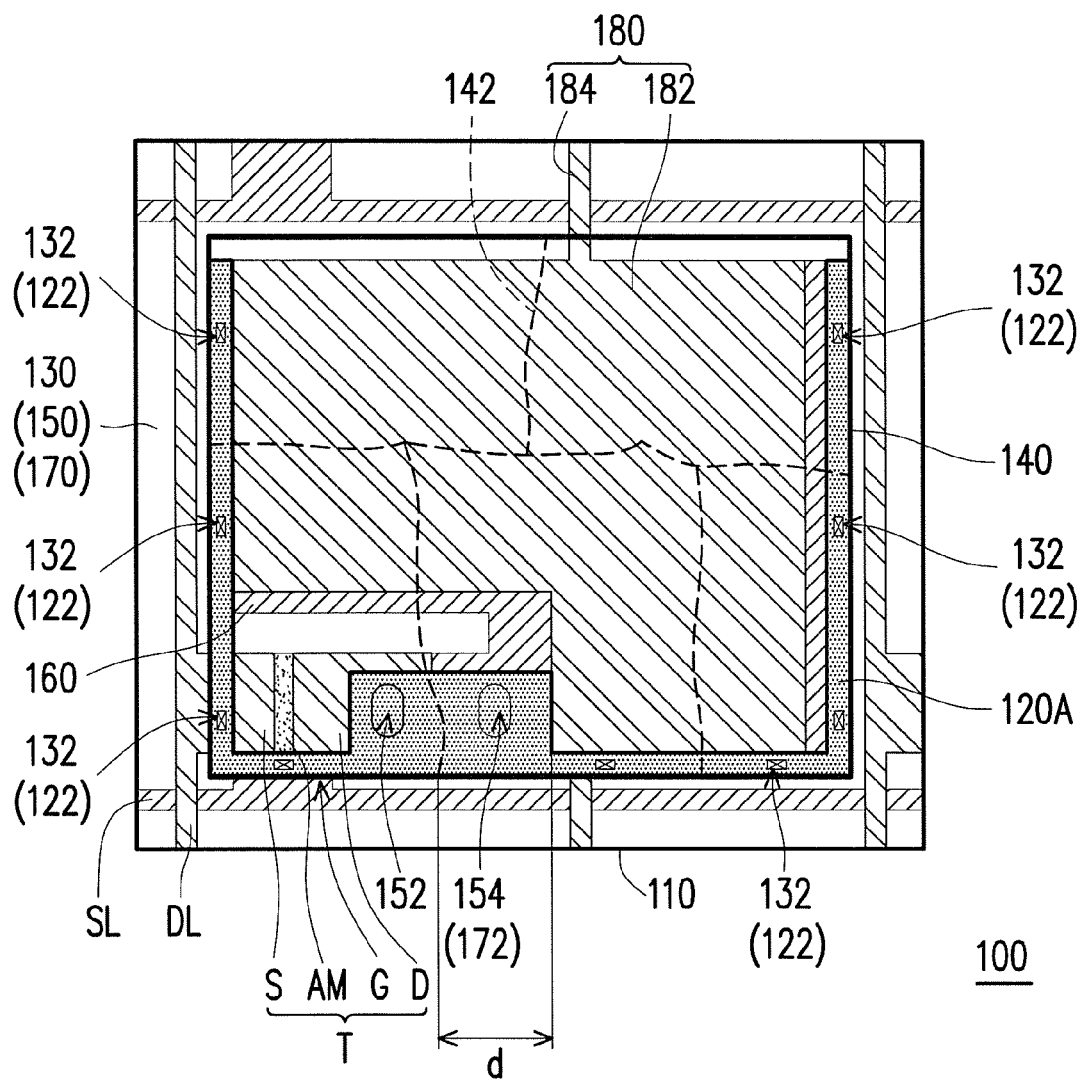
FIG. 3 is a schematic top view illustrating a pixel structure according to another exemplary embodiment of the invention.
Figure 4:
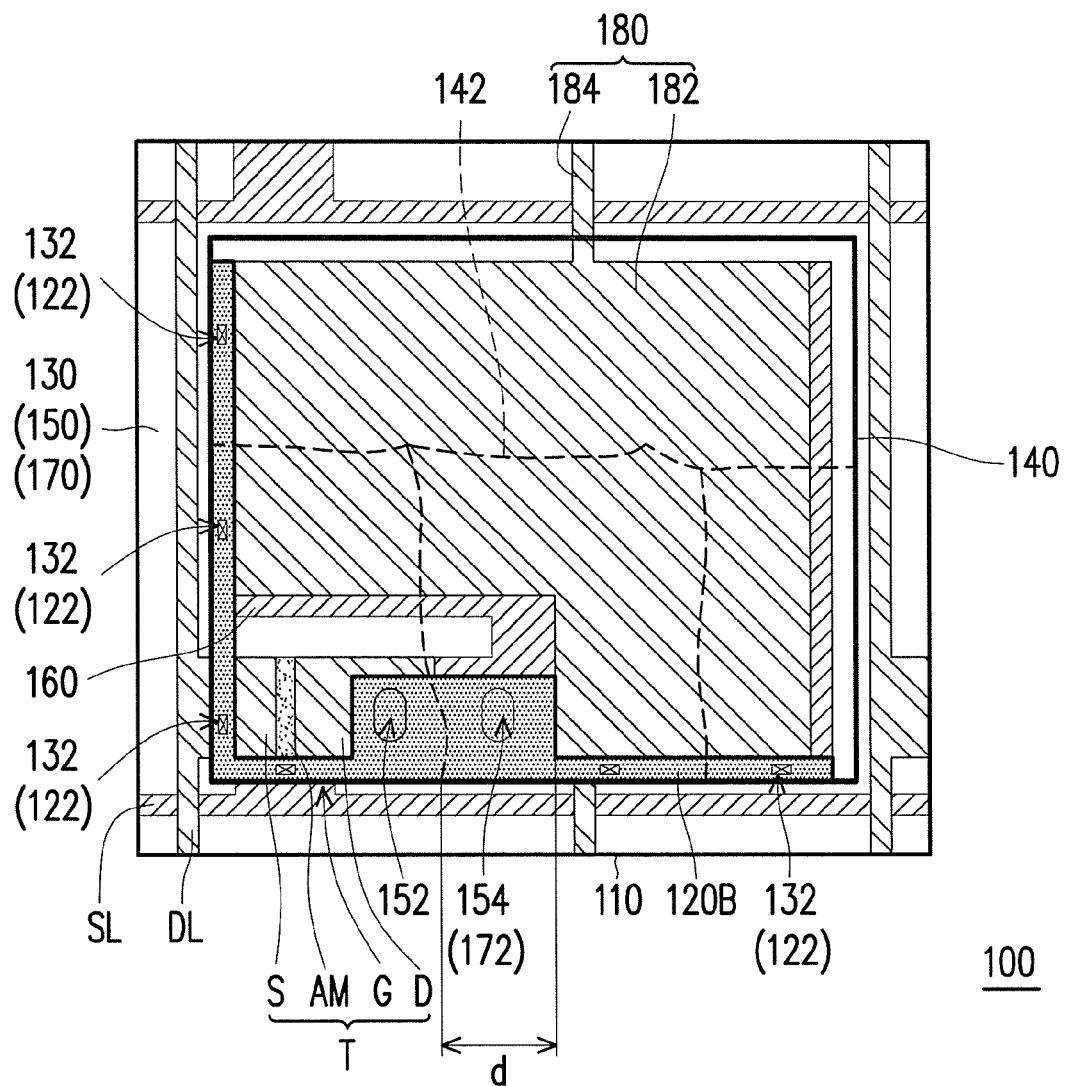
FIG. 4 is a schematic top view illustrating a pixel structure according to still another exemplary embodiment of the invention.

Note that the design of the conductive pattern 120 and the relative locations of the conductive pattern 120, the pixel electrode 140, the capacitor electrode 180, and the auxiliary electrode 160 are not restricted to those shown in FIG. 1 and FIG. 2, and people having ordinary skill in the art may make proper modifications according to actual requirements of the pixel structure 100. The following explanations are provided with reference to FIG. 2 and FIG. 3. FIG. 3 is a schematic top view illustrating a pixel structure according to another exemplary embodiment of the invention. Except for the conductive pattern 120A, other components shown in FIG. 3 are identical to the corresponding components depicted in FIG. 1 and thus share the same reference numbers. With reference to FIG. 3, the conductive pattern 120A is substantially a U-shaped pattern that surrounds the pixel electrode 140, and the length of two sides of the U-shaped pattern may be the same or different. FIG. 4 is a schematic top view illustrating a pixel structure according to still another exemplary embodiment of the invention. Except for the conductive pattern 120B, other components shown in FIG. 4 are identical to the corresponding components depicted in FIG. 1 and thus share the same reference numbers. With reference to FIG. 4, the conductive pattern 120B is substantially an L-shaped pattern that surrounds the pixel electrode 140.

Figure 5:
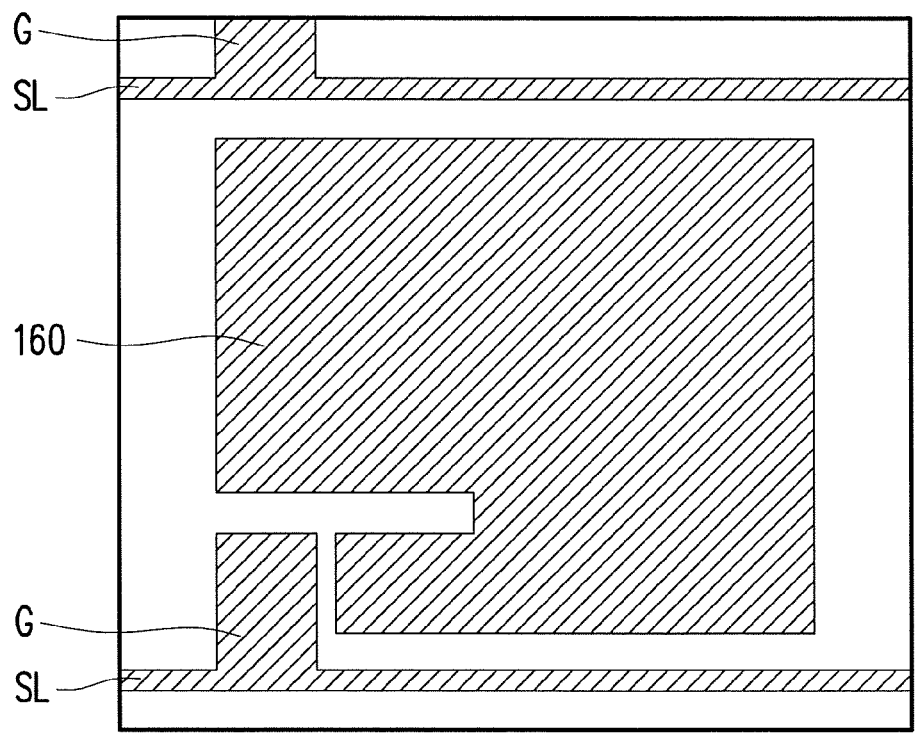
FIG. 5 to FIG. 12 are schematic top views illustrating film layers in the pixel structure of FIG. 1.

FIG. 5 to FIG. 12 are schematic top views illustrating film layers in the pixel structure of FIG. 1, and the pattern of each film layer is clearly shown in these figures. With reference to FIG. 1, FIG. 2, and FIG. 5, a first metal layer M1 is located between the second insulation layer 170 and the flexible substrate 110. The first metal layer M1 includes the scan line SL, the gate G, and the auxiliary electrode 160. The scan line SL and the gate G are physically and electrically connected to each other. By contrast, the auxiliary electrode 160 is neither physically connected to the scan line SL nor physically connected to the gate G. Accordingly, the auxiliary electrode 160 is electrically insulated from the scan line SL and the gate G.

Figure 6:
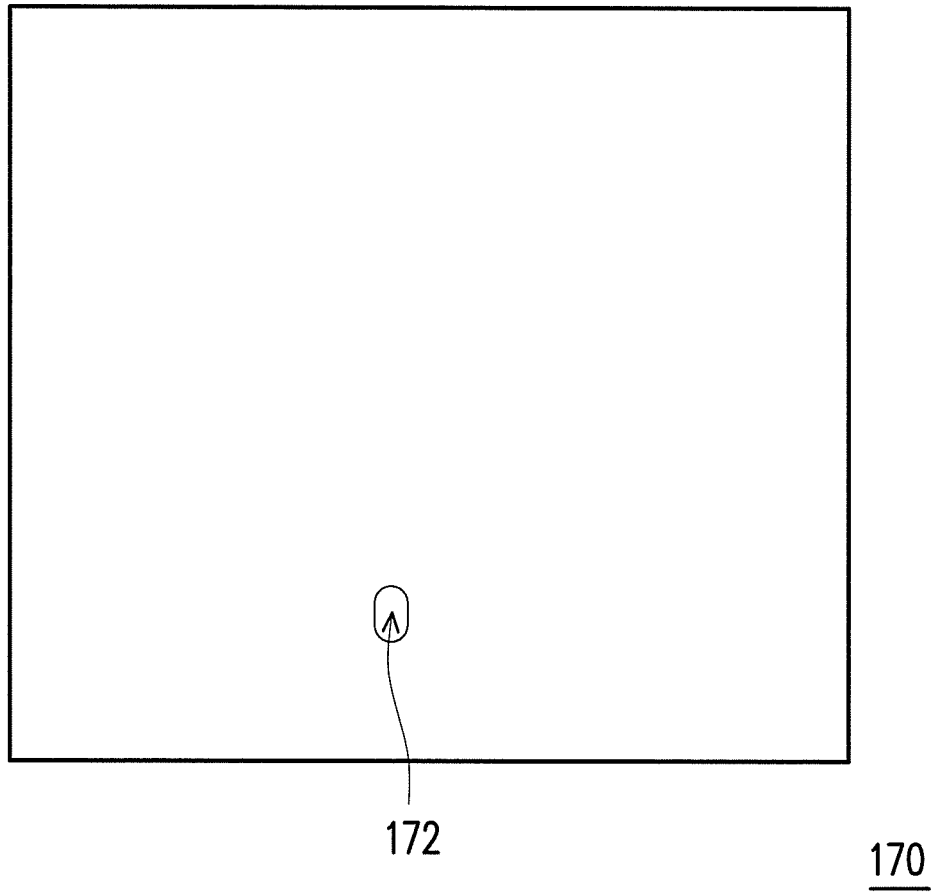
Figure 7:
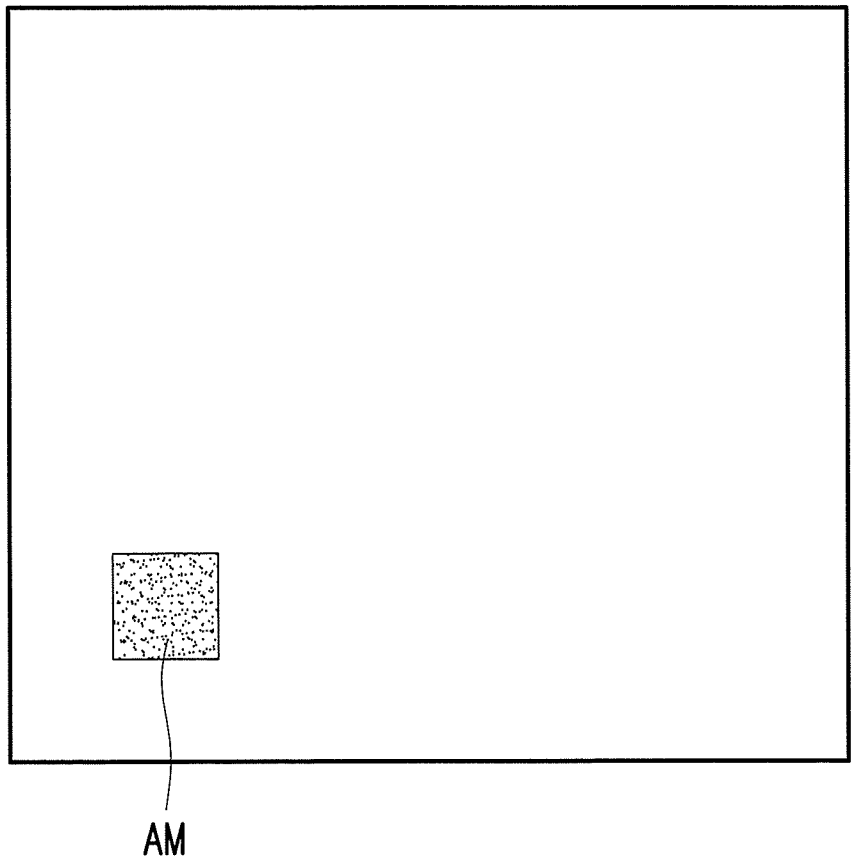
Figure 8:
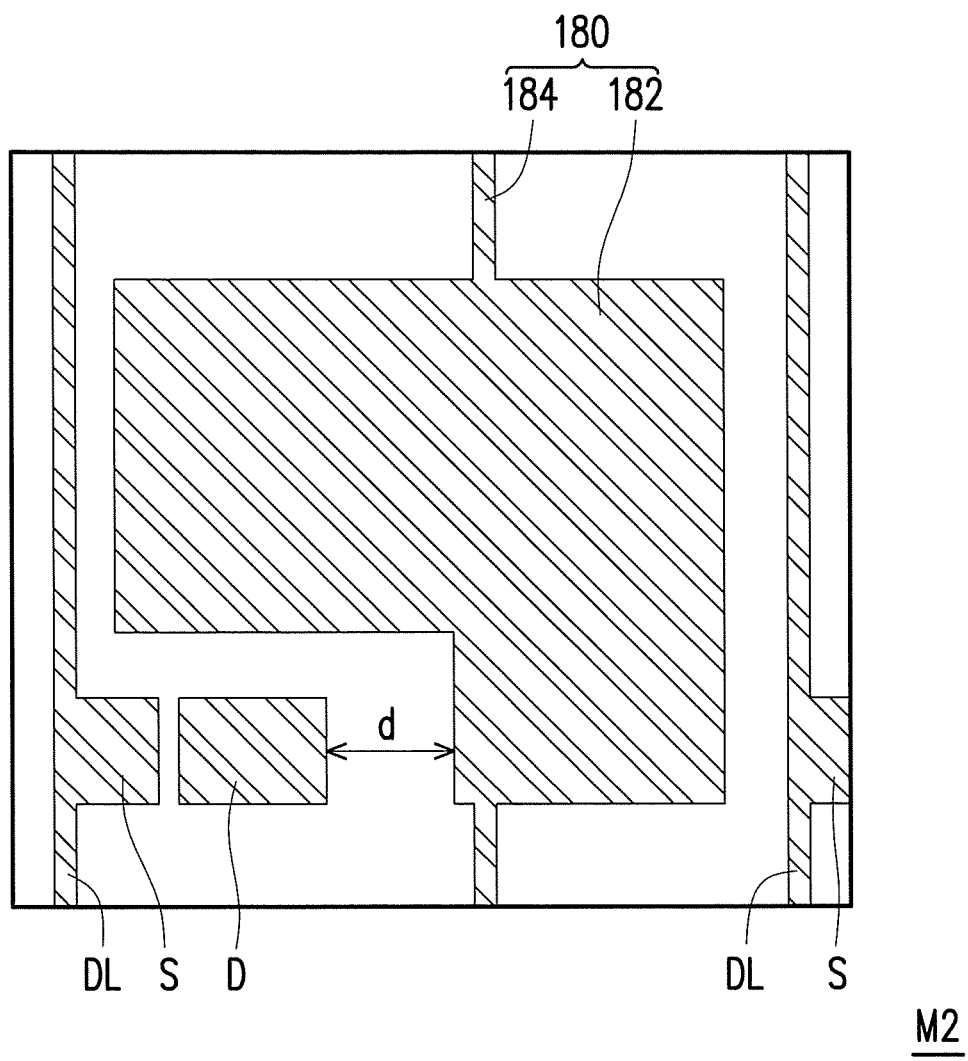

With reference to FIG. 1, FIG. 2, and FIG. 6, the second insulation layer 170 substantially covers the first conductive layer M1 and has the second contact hole 172 that exposes the auxiliary electrode 160. With reference to FIG. 1, FIG. 2, and FIG. 7, a channel layer has the channel AM which covers a portion of the gate G. With reference to FIG. 1, FIG. 2, and FIG. 8, a second metal layer M2 is located between the third insulation layer 150 and the second insulation layer 170. The second metal layer M2 includes the data line DL, the source S, the drain D, and the capacitor electrode 180. The source S is physically connected to the data line DL. Here, the source S and the drain D are two conductive patterns that are separated from each other. In FIG. 2, the source S and the drain D are correspondingly connected to the channel AM located above the gate G. The capacitor electrode 180 is not physically connected to the data line DL, the source S, and the drain D and is electrically insulated from the data line DL, the source S, and the drain D. In the present exemplary embodiment, there is a distance d between the capacitor electrode 180 and the drain D, and the second contact hole 172 of the second insulation layer 170 is located within an area defined by the distance d. As such, parts of the auxiliary electrode 160 are not overlapped with the capacitor electrode 180 but exposed by the second contact hole 172.

Figure 9:
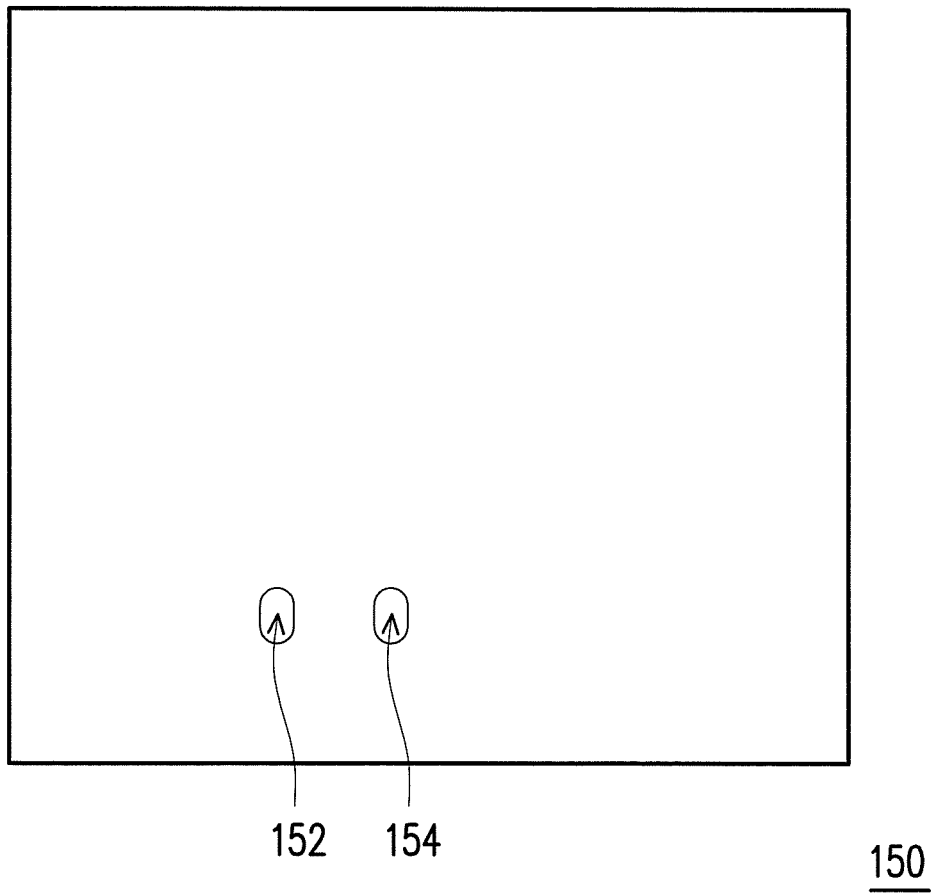
Figure 10:
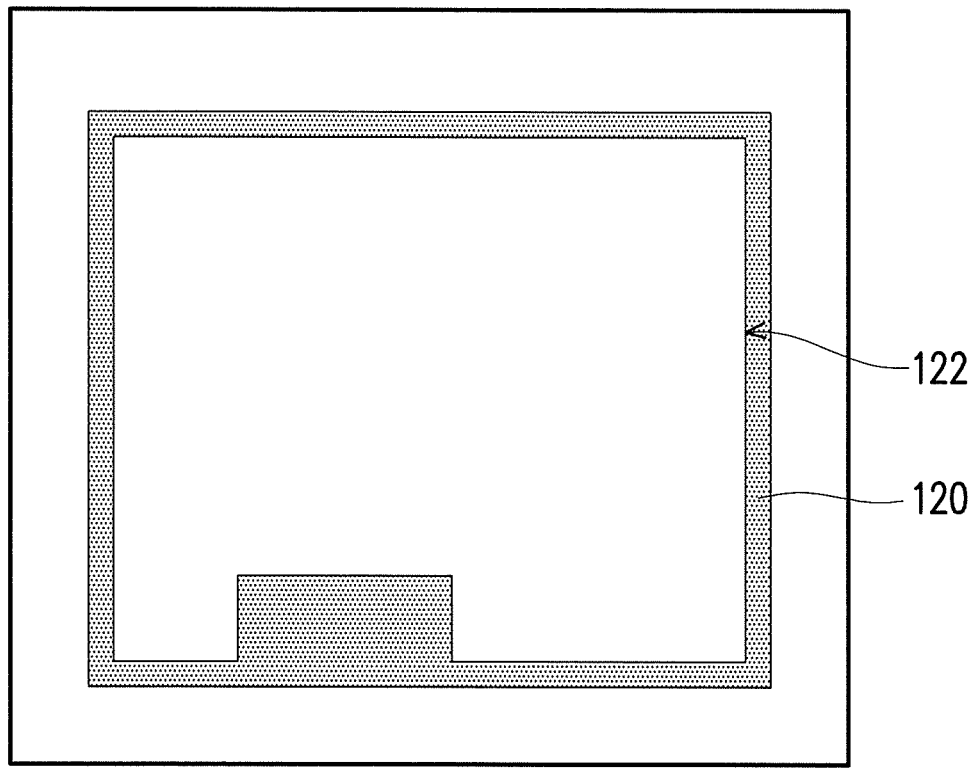
Figure 11:
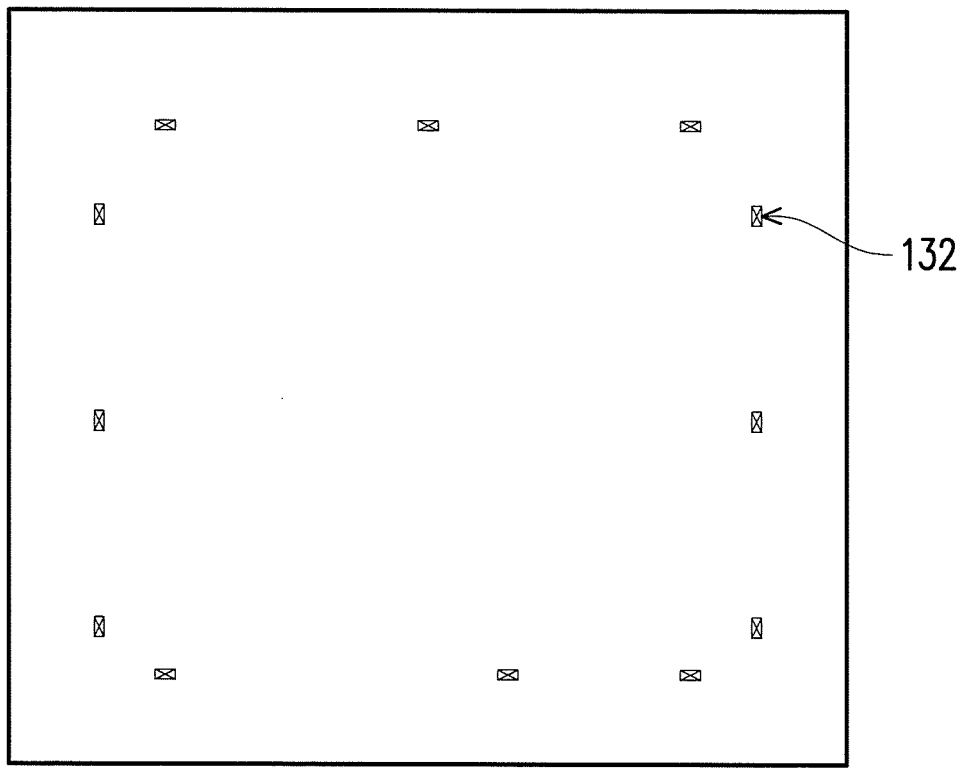
Figure 12:
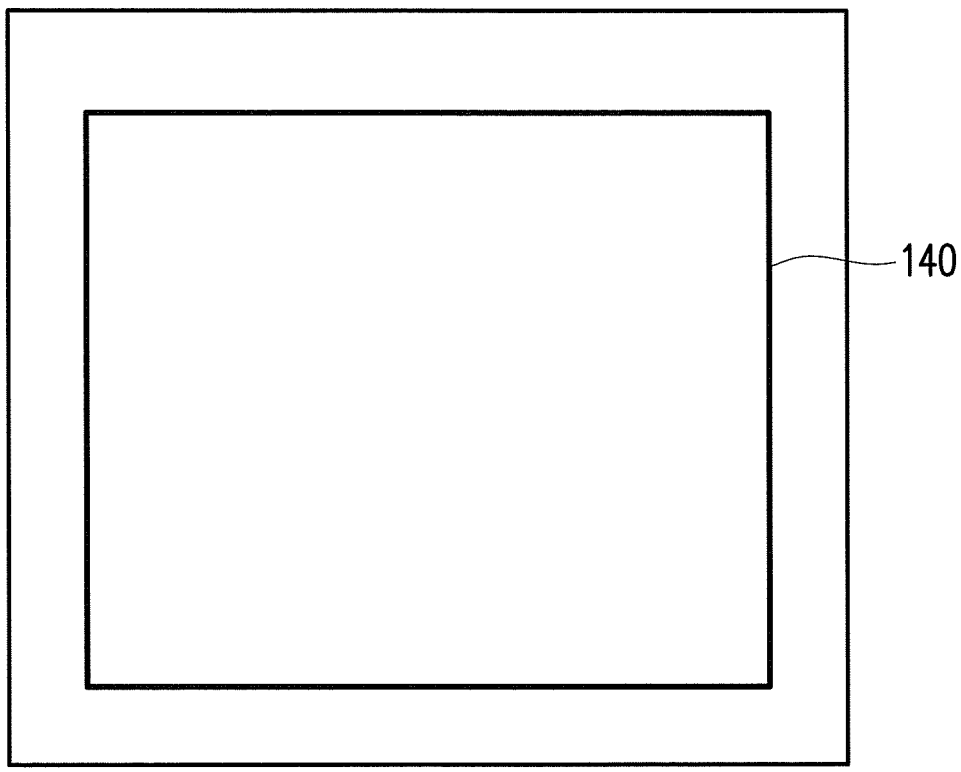

With reference to FIG. 1, FIG. 2, and FIG. 9, the third insulation layer 150 has the third contact holes 152 and 154. The location of the third contact hole 152 corresponds to the drain D of the second metal layer M2, and the location of the third contact hole 154 corresponds to the second contact hole 172 of the second insulation layer 170. Therefore, the third contact hole 154 and the second contact hole 172 together expose the auxiliary electrode 160. With reference to FIG. 1, FIG. 2, and FIG. 10, a third metal layer M3 includes the conductive pattern 120. According to the present exemplary embodiment, the conductive pattern 120 covers parts of an edge area of the auxiliary electrode 160 and the connection portion 184 of the capacitor electrode 180, and the conductive pattern 120 also surrounds and exposes the electrode portion 182 of the capacitor electrode 180. With reference to FIG. 1, FIG. 2, and FIG. 11, the first insulation layer 130 has a plurality of first contact holes 132. The first contact holes 132 respectively expose the conductive points 122 of the conductive pattern 120. With reference to FIG. 1, FIG. 2, and FIG. 12, the first contact holes 132 are filled with the pixel electrode 140, such that the pixel electrode 140 is in contact with the conductive points 122 of the conductive pattern 120.

To sum up, the pixel electrode in the pixel structure described in an exemplary embodiment of the invention is electrically connected to the conductive pattern through the contact holes, and the conductive pattern is electrically connected to the active device. Hence, even though the pixel electrode is broken into a plurality of separated sub-pixel electrodes during the impact test, the sub-pixel electrodes can be connected to the conductive pattern through the corresponding contact holes and can further be electrically connected to the active device. Thereby, the pixel electrode is not apt to malfunction even through it is broken during the impact test, and accordingly the pixel structure is more likely to pass the impact test.

What is claimed is:
1. A pixel structure comprising:
a flexible substrate;
an active device disposed on the flexible substrate, the active device comprising a gate, a channel, a source, and a drain, the source and the drain being connected to the channel and separated from each other, the channel and the gate being stacked in a thickness direction;

a conductive pattern electrically connected to the drain of the active device, the active device being located between the conductive pattern and the flexible substrate;

a first insulation layer covering the conductive pattern and having a plurality of first contact holes distributed at a periphery of a pixel electrode, the first contact holes exposing a portion of the conductive pattern; and the pixel electrode electrically connected to the conductive pattern through the first contact holes, the first insulation layer being located between the pixel electrode and the conductive pattern.

2. The pixel structure as recited in claim 1, wherein the first contact holes of the first insulation layer respectively expose a plurality of conductive points of the conductive pattern, and the conductive points are arranged in a scattered manner.

3. The pixel structure as recited in claim 2, wherein the conductive points are scattered and located at a periphery of the pixel electrode.

4. The pixel structure as recited in claim 1, wherein the conductive pattern is located at a periphery of the pixel electrode.

5. The pixel structure as recited in claim 1, wherein the conductive pattern is a ring-shaped pattern surrounding the pixel electrode.

6. The pixel structure as recited in claim 1, wherein the conductive pattern and a periphery of the pixel electrode are overlapped when observed in a direction perpendicular to the flexible substrate.

7. The pixel structure as recited in claim 1, further comprising a capacitor electrode located between the flexible substrate and the pixel electrode and the capacitor electrode electrically connected to a reference potential.

8. The pixel structure as recited in claim 7, further comprising an auxiliary electrode disposed between the flexible substrate and the capacitor electrode and the auxiliary electrode being electrically connected to the conductive pattern.

9. The pixel structure as recited in claim 8, further comprising a second insulation layer and a third insulation layer, the second insulation layer being located between the auxiliary electrode and the capacitor electrode, the third insulation layer being located between the capacitor electrode and the conductive pattern.

10. The pixel structure as recited in claim 9, wherein the second insulation layer has a second contact hole, the third insulation layer has two third contact holes, one of the third contact holes communicates with the second contact hole, the other of the third contact holes exposes the drain of the active device, the second contact hole and the third contact hole communicating with the second contact hole are filled with the conductive pattern and the conductive pattern is electrically connected to the auxiliary electrode, and the third contact hole exposing the drain of the active device is filled with the conductive pattern and the conductive pattern is electrically connected to the drain of the active device.

11. The pixel structure as recited in claim 1, further comprising a data line and a scan line, the data line being connected to the source, the scan line being connected to the gate.

* * * * *